United States Patent
Owen et al.

(10) Patent No.: US 11,120,239 B2
(45) Date of Patent: Sep. 14, 2021

(54) ELECTRONIC DEVICE MANAGEMENT IN A DATACENTER

(71) Applicant: International Business Machines Corporation, Armonk, NY (US)

(72) Inventors: John A. Owen, Winchester (GB); Colin Ian Holyoake, Braishfield (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/684,935

(22) Filed: Nov. 15, 2019

(65) Prior Publication Data

US 2021/0150166 A1    May 20, 2021

(51) Int. Cl.
*G06K 7/14* (2006.01)
*H05K 7/14* (2006.01)
*G06K 7/12* (2006.01)

(52) U.S. Cl.
CPC ............. *G06K 7/1417* (2013.01); *G06K 7/12* (2013.01); *G06K 7/1413* (2013.01); *H05K 7/1498* (2013.01)

(58) Field of Classification Search
CPC .... H04L 67/125; H04L 67/303; H04L 67/325
USPC .............. 235/462.1, 462.17, 462.46, 472.02
See application file for complete search history.

(56) References Cited

U.S. PATENT DOCUMENTS

| 10,164,837 | B2 | 12/2018 | Peng et al. |
| 10,198,709 | B2 | 2/2019 | Brignone et al. |
| 10,242,546 | B1* | 3/2019 | Wright ............... G05D 23/1917 |
| 2011/0024500 | A1* | 2/2011 | McReynolds ...... G06K 17/0022 235/385 |
| 2017/0091607 | A1* | 3/2017 | Emeis ................... G06T 19/006 |
| 2017/0134474 | A1* | 5/2017 | Gao ...................... H04L 67/325 |
| 2017/0327312 | A1* | 11/2017 | Hoehler ................. B65G 1/137 |
| 2018/0024598 | A1 | 1/2018 | Bermudez Rodriguez et al. |
| 2019/0053397 | A1 | 2/2019 | Larson et al. |
| 2020/0250044 | A1* | 8/2020 | Sharma ............... H04L 67/1095 |

OTHER PUBLICATIONS

Mell et al., "The NIST Definition of Cloud Computing," Recommendations of the National Institute of Standards and Technology, U.S. Department of Commerce, Special Publication 800-145, Sep. 2011, 7 pages.
"RackTables," Printed Nov. 15, 2019, 1 page, http://www.racktables.org/about.php.

* cited by examiner

*Primary Examiner* — Daniel St Cyr
(74) *Attorney, Agent, or Firm* — Grant Johnson

(57) ABSTRACT

A method and related system are used for device management in a datacenter having multiple racks adapted to house multiple devices. The system may comprise an optical sensor and a reporting unit. The optical sensor may be provided at a position in a rack in a datacenter, the optical sensor configured to sense device identifying data of a device inserted in the rack. The reporting unit may transmit the sensed device identifying data and the position in a message to a central data processing system for the datacenter.

12 Claims, 4 Drawing Sheets

ELECTRONIC DEVICE MANAGEMENT IN A DATACENTER

BACKGROUND

The present disclosure relates to electronic device management in a datacenter, and more specifically, to management of physical electronic devices in a datacenter in which multiple racks may house multiple electronic devices.

Datacenter configuration is a key and critical part of managing a datacenter. The knowledge of "what machine is where" covers capacity planning and also asset management and physical audit requirements.

A single rack may contain many electronic devices in the form of servers and/or switches and these can be moved within a rack; for example, to consolidate the existing servers into adjacent positions so a new server can be inserted into the rack. Servers can also be moved between racks. In both cases, moving the server requires asset management details to be updated accordingly.

SUMMARY

According to an aspect of the present disclosure, a system is provided for device management in a datacenter having multiple racks adapted to house multiple devices. The system may comprise an optical sensor and a reporting unit. The optical sensor may be provided at a position in a rack in a datacenter, the optical sensor configured to sense device identifying data of a device inserted in the rack. The reporting unit may transmit the sensed device identifying data and the position in a message to a central data processing system for the datacenter.

According to another aspect of the present disclosure, a computer-implemented method for device management in a datacenter having multiple racks adapted to house multiple devices. The method may comprise receiving device identifying data from a plurality of optical sensors provided at positions on the rack, combining the device identifying data with the positions of the plurality of optical sensors in a message, and transmitting the message to a central data processing system for the datacenter. In some embodiments, the plurality of optical sensors may be configured to sense device identifying data of a device inserted in the rack.

According to another aspect of the present disclosure, a computer program product for datacenter device management is provided, the computer program product for a rack at a datacenter, a computer readable storage medium having program instructions embodied therewith. The program instructions may be executable by a processor at a reporting unit of the rack to cause the processor to receive device identifying data from multiple optical sensors provided at fixed positions on the rack, combine the device identifying data with a position of a sensing optical sensor in a message, and transmit the message to a central data processing system for the datacenter. The optical sensor may be configured to sense device identifying data of a device inserted in the rack.

According to an aspect of the present disclosure, there is provided a system for electronic device management in a datacenter having multiple racks each housing multiple electronic devices, the system at each rack comprising: multiple optical sensors provided at fixed positions on the rack in the datacenter, each optical sensor configured to sense electronic device identifying data of an electronic device inserted in the rack; and a reporting unit at each sensor or provided for multiple sensors in a rack for transmitting sensed electronic device identifying data together with a sensor position in a message to a central data processing system for the datacenter.

According to another aspect of the present disclosure, there is provided a computer-implemented method for electronic device management in a datacenter having multiple racks, each housing multiple electronic devices, carried out by a reporting unit at a rack in the datacenter and comprising: receiving electronic device identifying data from multiple optical sensors provided at fixed positions on the rack, each optical sensor configured to sense electronic device identifying data of an electronic device inserted in the rack; combining the electronic device identifying data with a position of a sensing optical sensor in a message; and transmitting the message to a central data processing system for the datacenter.

According to a further aspect of the present disclosure, there is provided a computer program product for datacenter electronic device management, the computer program product for a rack at a datacenter comprising a computer readable storage medium having program instructions embodied therewith, the program instructions executable by a processor at a reporting unit of the rack to cause the processor to: receive electronic device identifying data from multiple optical sensors provided at fixed positions on the rack, each optical sensor configured to sense electronic device identifying data of an electronic device inserted in the rack; combine the electronic device identifying data with a position of a sensing optical sensor in a message; and transmit the message to a central data processing system for the datacenter.

The computer readable storage medium may be a non-transitory computer readable storage medium and the computer readable program code may be executable by a processing circuit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
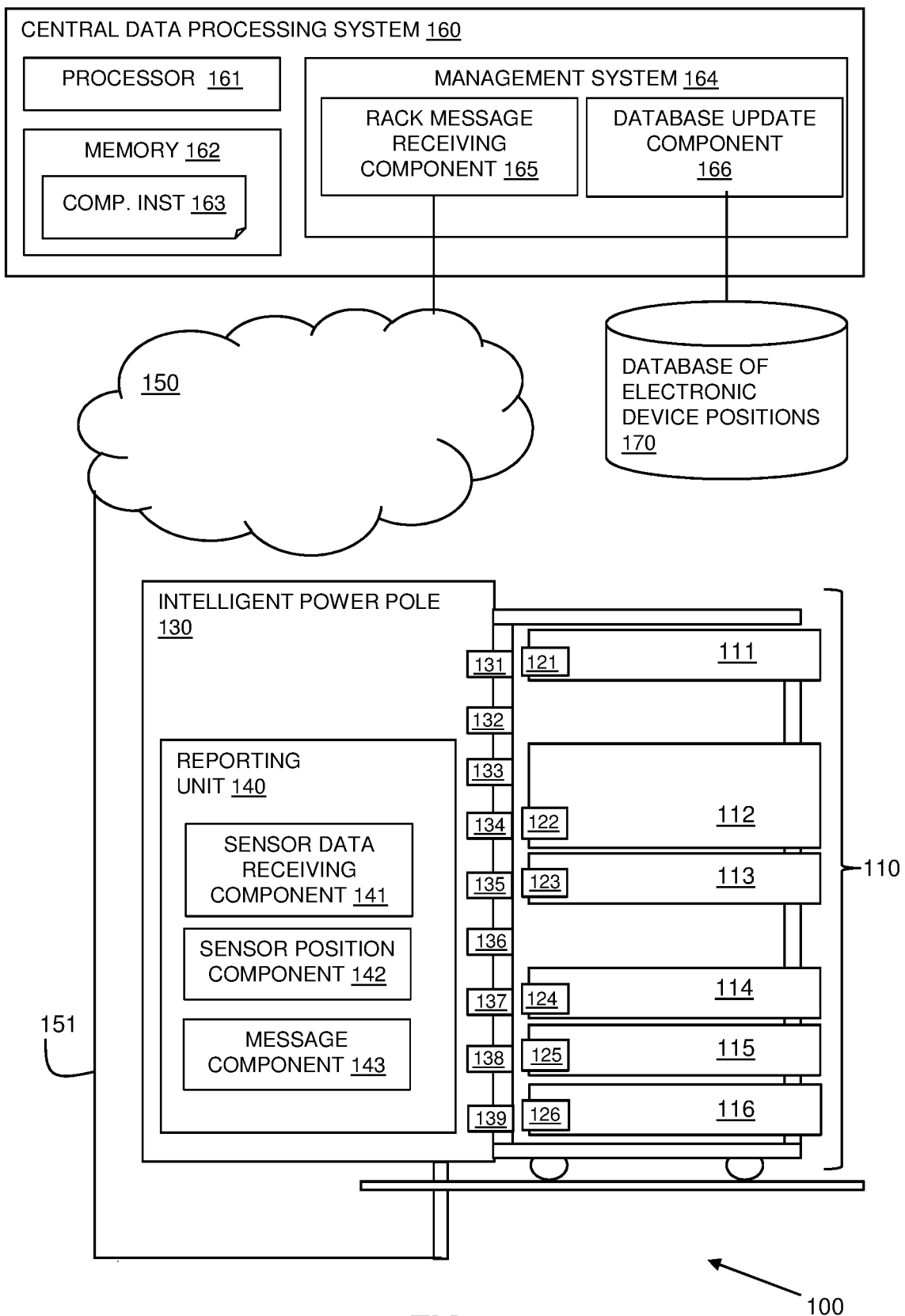
FIG. 1 is a schematic block diagram of an example embodiment of a datacenter system in accordance with the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Some embodiments provide a datacenter system for identifying and managing electronic devices installed in multiple racks in the datacenter in order to perform dynamic and active physical asset management. The system may extend to more than one position of datacenter. The electronic devices may include servers, storage systems, compute nodes, networking systems, switches or other computing and information technology devices.

A datacenter may be a centralized position where computing and networking equipment is concentrated for processing, storing, and distributing large amounts of data. The equipment may be housed in multiple racks that make efficient use of space while ensuring cooling with chilled airflow, water flow, or some other cooling technology. The computing equipment may be stored and organized in racks. The racks may include integrated power and networking systems and their cabling may run via underfloor cable management routes.

Some embodiments identify data processing equipment in the form of electronic devices installed within racks in a datacenter by using an optical detector located in a datacenter rack to preform dynamic and active physical asset management. The system utilizes an optical display (e.g., a light emitting diode, infrared emitter, QR code, bar code, or the like) located in or on the electronic device(s) to transmit or otherwise provide data identifying the electronic device, which may be detected by an optical detector in a data center rack when the electronic device is inserted into the rack.

The physical position of electronic devices within the datacenter may then be managed using a central data processing system that receives the identifying data and physical positions of the optical detectors from the racks.

Referring to FIG. 1, a schematic block diagram illustrates an example embodiment of the system as provided in a datacenter 100. The datacenter 100 includes multiple racks 110 and the described system includes a central data processing system 160 for managing the electronic devices 111-116 housed in the racks 110 by dynamically maintaining a database 170 of the physical positions of the electronic devices 111-116 in the racks 110 in the datacenter 100. The racks 110 may be connected to the central data processing system 160 via a network 150 of wired or wireless connections.

The physical positions of the electronic devices 111-116 in a rack 110 may be sensed by racks having multiple optical sensors 131-139 provided at regular, fixed positions in the rack 110, such as vertically spaced on a rear interior surface of the rack. The optical sensors 131-139 may be configured to sense data as displayed by an optical display 121-126 on an electronic device 111-116 inserted in the rack 110. The sensed data may include electronic device identifying data, such as a model and serial number of an electronic device 111-116.

In the illustrated embodiment, the rack 110 has an intelligent power pole 130 in the form of a power distribution unit that has intelligence built into it. The intelligent power pole 130 may be used to transmit the sensed identifying information and the positions of the electronic devices via a network connected power supply 151.

One feature and advantage of embodiments that use the intelligent power pole 130 to transmit the sensed identifying information and positions is that these devices may conventionally gather data such as temperature and humidity from external sensors that are plugged into the intelligent power pole 130, for example, via an Ethernet connection. Therefore, existing functionality of the power pole 130 to receive data and send messages via network messaging may be used to receive the sensed position data and transmit this using a software update for adaptation for the described position messages.

In some embodiments, a rack 110 may include a reporting unit 140 communicatively coupled to the optical sensors 131-139 in the rack 110, which may gather electronic device identifying data from the multiple optical sensors 131-139 of the rack 110 and combine the electronic device identifying data with a position of the sensing optical sensor 131-139 in a message. In some embodiments, the reporting unit 140 may combine the electronic device identifying data from the multiple optical sensors 131-139 with an identifier associated with the sensor, which may be matched with position data pre-stored with a central data processing system 160.

The reporting unit 140 may be a unit at a rack 110 for receiving the optical sensor data and sending it to an intelligent power pole 130 of the rack 110 prior to using the intelligent power pole 130 communication to a central data processing system 160. The reporting unit 140 may comprise a computing component including a processor or a microprocessor and memory providing computer software instructions in the form of components for execution by the processor or microprocessor. The components may include: a sensor data receiving component 141 for receiving new data as sensed by the optical sensors 131-139; a sensor position component 142 for identifying the position in the rack of a sensor sensing new data; and a message component 143 for compiling the sensed data. The compiled sensed data may identify an electronic device 111 as provided by the optical display 121 with the position of the electronic device 111 in the rack as determined by the position of the optical sensor 131 receiving the displayed data.

In some embodiments, a reporting unit 140 may be provided as part of the optical sensors 131-139 and may transmit data that it detects along with the sensor's position individually to the central data processing system 160 via a message.

The message may be sent via a network connected power supply 151 from the rack 110 to the central data processing system 160 and may further contain an identifier of the rack 110 from which the message is transmitted.

The central data processing system 160 may include at least one processor 161, a hardware module, or a circuit for executing the functions of the described components which may be software units executing on the at least one processor. Multiple processors running parallel processing threads may be provided enabling parallel processing of some or all of the functions of the components. Memory 162 may be configured to provide computer instructions 163 to the at least one processor 161 to carry out the functionality of the components.

The central data processing system 160 includes a management system 164 including a rack message receiving component 165 for receiving messages providing electronic device position data from the multiple racks. The management system 164 includes a database update component 166 for updating a database 170 of electronic device positions as a dynamic record for management of the electronic devices. Messages are sent whenever an electronic device is installed, moved, or removed in a rack 110.

The electronic devices 111-116 includes an optical display 121-126 configured to transmit electronic device identifying data to be received by an optical sensor 131-139 in a position in which the electronic device 111-116 is inserted in a rack 110.

In some embodiments, the optical display 121-126 may be a graphical code and the multiple optical sensors 131-139 are graphical code readers.

In some embodiments, the optical display 121-126 may be a light emitting diode acting as a visible light communication device controlled by the electronic device 111-116 and disposed in a casing of the electronic device 111-116 and the multiple optical sensors 131-139 are visible light communication readers.

Figure 2:
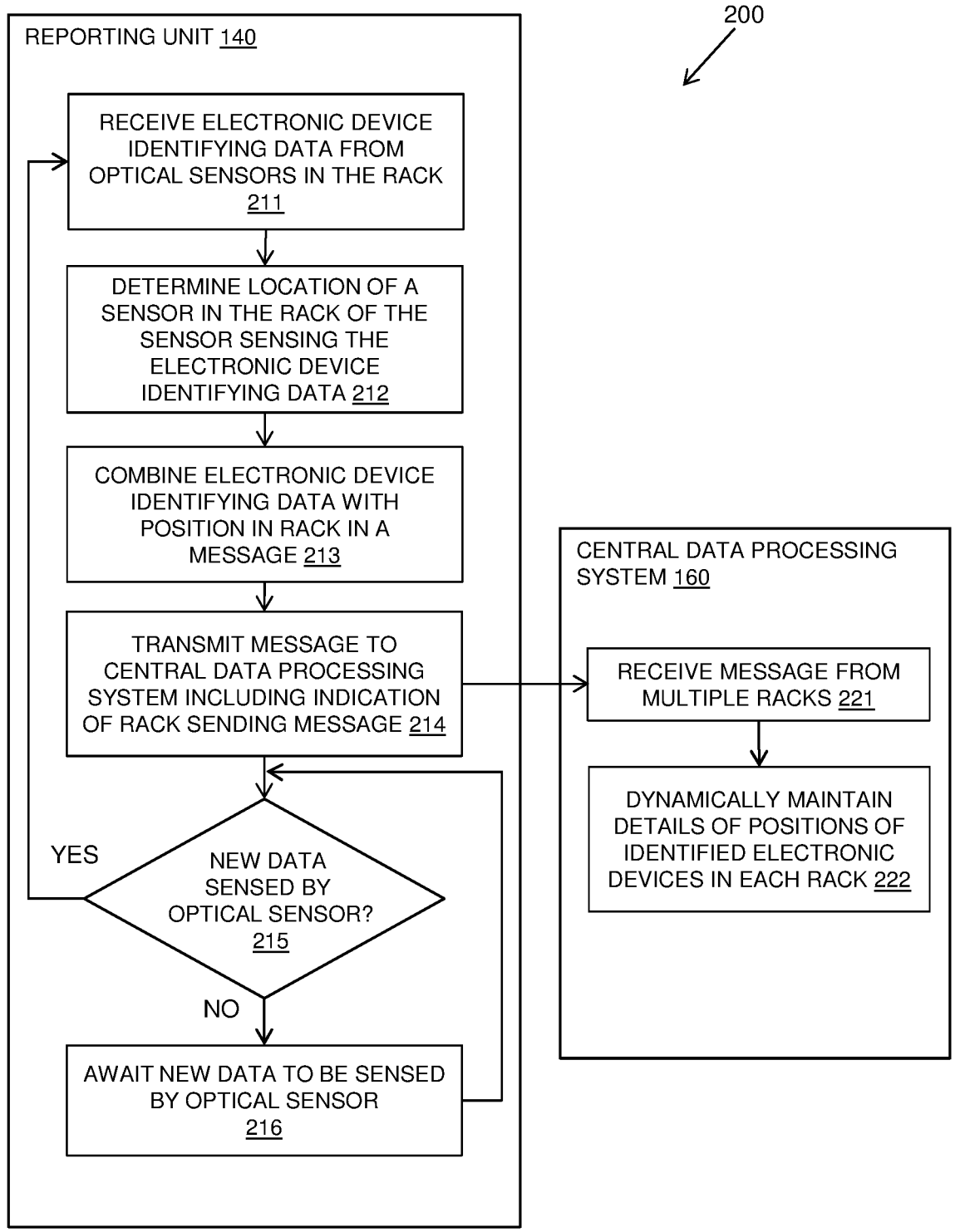
FIG. 2 is a flowchart of an example embodiment of a method in accordance with the present disclosure.

Referring to FIG. 2, a flow diagram 200 shows an example embodiment of a method carried out at a reporting unit 140 for multiple optical sensors at a rack and at a central processing system 160.

A reporting unit 140 at a rack in the datacenter may receive 211 electronic device identifying data from the multiple optical sensors provided at fixed positions on the rack. An optical sensor at the rack may be configured to sense electronic device identifying data from an optical display of an electronic device that is inserted in the rack. Electronic device identifying data may include an electronic device's model number and serial number.

New electronic device identifying data is received 211 when an electronic device is inserted at a new position in a rack, either as it is newly installed or as it is moved from another position. The optical sensors may be configured so that they send updated data to their reporting unit if they start to sense data or if data they are sensing changes. Alternatively, the sensors may continuously send any data they sense to the reporting unit for the rack and the reporting unit monitors changes in the sensed data.

The reporting unit 140 may determine 212 a location of an optical sensor that has sensed new or changed electronic device identifying data. The reporting unit 140 may combine 213 the electronic device identifying data with a position of the sensing optical sensor in a message and may transmit 214 the message to a central data processing system 160 for the datacenter. The message may also include an identifier of the rack from which it is being transmitted.

Transmitting 214 the message to a central data processing system 160 of a datacenter may transmit the message via a network connected power supply. The reporting unit 140 may be provided in an intelligent power pole of a rack and the message may be transmitted from the intelligent power pole via an Internet Protocol address of a power supply contained within the network's Domain Name Service.

The reporting unit 140 may determine 215 if new or changed data is sensed by an optical sensor in its rack. If so, the method loops to receive 211 the new data, determine 212 the position of the sensor sensing the new data, combine 213 the new data with the position of the sensor, and transmit 214 a new message to the central data processing system 160.

If it is determined 215 that no new or changed data has been sensed by the optical sensors in the rack, the method may await 216 new or changed data.

Various configurations of data monitoring and updates may be used between an optical display and an optical sensor. These may include an initial "hello" message that may be recognized by the optical sensor as indicating a change of data and triggering an asset change event. At periodic times a "hello" message may be sent to confirm the current status, for example, to accommodate a loss of power in the rack. If the "hello" message is identical, then no changes are necessary. Another method may be a continued conversation between the optical display and the optical sensor, such as a heartbeat at a given time period subject to the frequency of changes made in the datacenter.

The central data processing system 160 may receive 221 messages from reporting units 140 of the multiple racks in the datacenter and may dynamically maintain 222 details of positions of electronic devices installed in the racks.

In some embodiments, new or existing LEDs of electronic devices may be used as the optical display components to send messages containing identifying details of an electronic device to a receiver built into a rack. The rack may then transmit the details received via a network connected power supply which is typical in datacenters.

Electronic devices such as servers in a datacenter rack may contain active LEDs typically to represent power state, error state, power or identifier. For example, the LEDs may flash on and off to help an engineer identify a device for servicing or error.

In some embodiments, the LEDs may be controlled by firmware embedded in the electronic device, such as its Unified Extensible Firmware Interface (UEFI), the Basic Input/output System (BIOS), or other controller that is aware of the identifying details of the electronic device, in order to display the identifying details via the LED using a light fidelity (Li-Fi) visible light communication (VLC) signal. The identifying details may be, for example, the serial number, machine type, and manufacturer, etc. of the electronic device.

VLC works by switching the current to the LEDs off and on at a very high speed. This may be too quickly to be noticed by the human eye to avoid flickering. Although Li-Fi LEDs need to be kept on to transmit data, they could be dimmed to below human visibility while still emitting enough light to carry data to an optical sensor in some embodiments.

Racks may have a supporting framework and rails for supporting equipment in the form of electronic devices such as servers. Rack sizes may be standardized for compatibility and a number of vertical rack units is denoted by "U" or as 1 rack unit 1 U with 1 U equal to 44.45 mm (1.75 inches). A rack often has mounting holes in the supporting framework that have spacings to suit equipment mountings. In some embodiments, the optical sensors may be provided at each U position such that one optical sensor is provided at each vertical position in a rack in which an electronic device may be inserted.

In an example, when an electronic device in the form of a server is pushed into a rack position, a Li-Fi signal may be registered with an optical sensor in the form of an Li-Fi receiver built into the rear of the back door at predefined U-positions of a rack in order to learn the server's model number and serial number. The Li-Fi message in some embodiments solely holds the identifying information and the position of the optical sensor provides the reference to where in the rack the server is located.

In one implementation, when an electronic device is inserted into a rack and an initial power feed is inserted into the electronic device, the LEDs may illuminate the electronic device's power state which is off by standard. This illumination of the LEDs may be used to commence the Li-Fi message, for example, with a "hello" message that is recognized by an optical sensor or a reporting unit in the rack.

A message including the sensed information and the sensor position in the form of a U-position in a rack may be communicated from the rack's power supply to a backend database. The communication may be via the IP address of the power supply, for example, 9.20.130.11=Rack RB1, contained within the network's DNS (Domain Name Service).

The details may be sent to a backend database to plot the full position of the server, including U position, serial number and model type.

Figure 3:
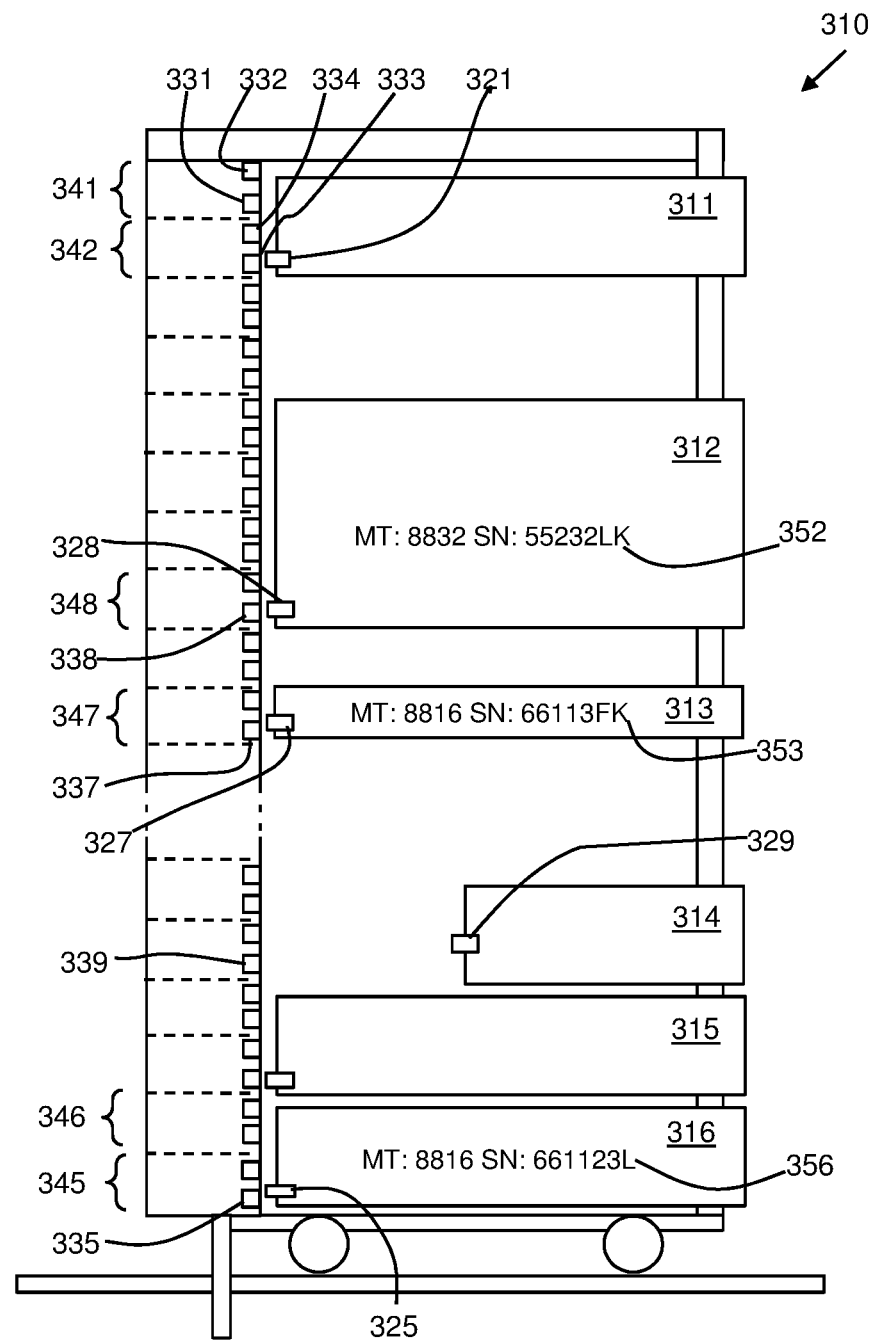
FIG. 3 is a side view of an example embodiment of a datacenter rack in accordance with the present disclosure.

Referring to FIG. 3, an example embodiment of a rack 310 is shown, consistent with some embodiments. The rack 310 is illustrated divided into U positions 341, 342 (only some labeled for clarity). A full-size rack may be 42 U high and typical half-height racks are 18-22 U.

The U position 341, 342 may have one or more optical sensors 331-334. An optical sensor 333 may be positioned in a standard height position in a U position 342 to correspond to a position on electronic devices 311 at which an optical display 321 is located. Alternatively, more than one optical sensor 331-332 may be provided in a U position 341 to accommodate different forms of electronic devices 311 that might have differently positioned optical displays 321. This may occur when an existing LED of an electronic device 311 is used as the optical display, which may vary in position between types of electronic device 311.

An intelligent power pole built into the rack 310 may have active network connections and a cable going underfloor for power supply and network connections may be provided as conventional in a datacenter rack.

The optical sensors may use the active network connections to connect back to a backend database to record identifying data of the detected electronic devices. The IP of the power pole may be set to the rack name and position via the domain name system (DNS). For example, IP address of the rack being 9.20.130.11=Rack AB1 so it may identify which servers are located in which racks.

In the illustrated example, different forms of electronic devices 311, 312, 313, 314, 315, 316 are shown installed in the rack 310. As illustrated:

An Li-Fi receiver 335 at U1 345 (first U in rack) detects an optical display 325 of electronic device 316 of "MT: 8816 SN: 661123L" 356, meaning machine type 8816 with serial number 661123L. Machine type 8816=2 U unit. This would declare U1 345 and U2 346 unavailable due to this electronic device 316.

An Li-Fi receiver 337 at U11 347 detects an optical display 327 of electronic device 313 of "MT: 8817 SN: 66113FK" 353, meaning machine type 8816 with serial number 66113FK. Machine type 8817=1 U unit.

An Li-Fi receiver 338 at U13 348 detects an optical display 328 of electronic device 312 of "MT: 8832 SN: 55232LK" 352. Machine type 8832 is a 4 U unit electronic device that declares that the above three U positions (U14, U15, U16) are also taken.

A half-length electronic device 314 may be installed in the rack 310 and an optical sensor 339 in the rack may detect the optical display 329 even though there is a space between the electronic device 314 and the rear of the rack 310.

The described system may be retrofitted to existing electronic devices through updates to system firmware, such as UEFI/BIOS to enable the use of existing LEDs in electronic devices to be used as the optical displays. Additionally, the LiFi sensors may be retrofitted to existing racks to enable the technology, as well as built into the new racks directly.

In another embodiment, optical displays in the form of bar-codes, Quick Response (QR) codes or other one or two-dimensional code displays may be attached during manufacturing to electronic devices or retrofitted in a position to the rear of the electronic device and QR code readers may be used as optical sensors to receive the information at predefined positions in a rack.

Retrofitting the solution in the form of optical displays, such as LEDs or QR codes, to existing servers and optical sensors, such as Li-Fi receivers or QR code readers, may allow datacenters to benefit from the described system without significant additional cost and without the need to purchase new racks and electronic devices.

The described system provides a scalable solution for datacenters which may significantly simplify and automate the asset management of rack mounted servers, reducing overheads, speeding up the notification of asset changes and avoiding mistakes caused by manual asset management processes.

Figure 4:
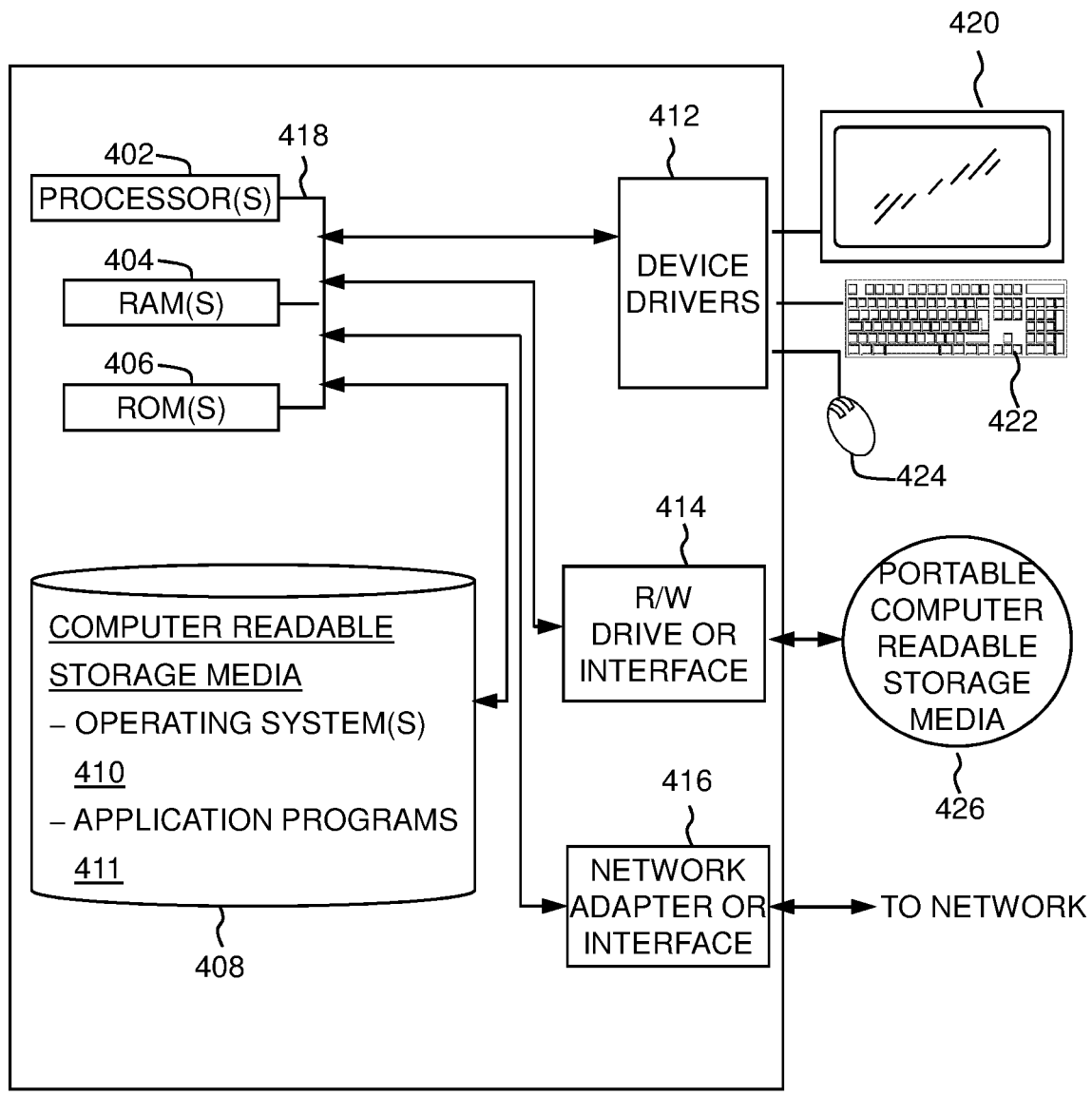
FIG. 4 is a block diagram of a computer system in which the present disclosure may be implemented in accordance with some embodiments.

FIG. 4 depicts a block diagram of components of a computing device such as the central data processing system 160 of FIG. 1, in accordance with some embodiments of the present disclosure. It should be appreciated that FIG. 4 provides only an illustration of one implementation and does not imply any limitations with regard to the environments in which different embodiments may be implemented. Many modifications to the depicted environment may be made.

The computing device may include one or more processors 402, one or more computer-readable RAMs 404, one or more computer-readable ROMs 406, one or more computer readable storage media 408, device drivers 412, read/write drive or interface 414, and network adapter or interface 416 interconnected over a communications fabric 418. Communications fabric 418 may be implemented with any architecture designed for passing data and/or control information between processors (such as microprocessors, communications and network processors, etc.), system memory, peripheral devices, and any other hardware components within the system.

One or more operating systems 410, and application programs 411, such as the management system 164 are stored on one or more of the computer readable storage media 408 for execution by one or more of the processors 402 via one or more of the respective RAMs 404 (which typically include cache memory). In the illustrated embodiment, each of the computer readable storage media 408 may be a magnetic disk storage device of an internal hard drive, CD-ROM, DVD, memory stick, magnetic tape, magnetic disk, optical disk, a semiconductor storage device such as RAM, ROM, EPROM, flash memory, or any other computer readable storage media that may store a computer program and digital information, in accordance with embodiments of the disclosure.

The computing device may also include a R/W drive or interface 414 to read from and write to one or more portable computer readable storage media 426. Application programs 411 on computing device may be stored on one or more of the portable computer readable storage media 426, read via the respective R/W drive or interface 414 and loaded into the respective computer readable storage media 408.

The computing device may also include a network adapter or interface 416, such as a TCP/IP adapter card or wireless communication adapter. Application programs 411 on computing device may be downloaded to the computing device from an external computer or external storage device via a network (for example, the Internet, a local area network or other wide area networks or wireless networks) and network adapter or interface 416. From the network adapter or interface 416, the programs may be loaded into the computer readable storage media 408. The network may comprise copper wires, optical fibers, wireless transmission, routers, firewalls, switches, gateway computers and edge servers.

The computing device may also include a display screen 420, a keyboard or keypad 422, and a computer mouse or touchpad 424. Device drivers 412 interface to display screen 420 for imaging, to keyboard or keypad 422, to computer mouse or touchpad 424, and/or to display screen 420 for pressure sensing of alphanumeric character entry and user selections. The device drivers 412, R/W drive or interface 414, and network adapter or interface 416 may comprise hardware and software stored in computer readable storage media 408 and/or ROM 406.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A computer program product of the present invention comprises one or more computer readable hardware storage devices having computer readable program code stored therein, said program code executable by one or more processors to implement the methods of the present invention.

A computer system of the present invention comprises one or more processors, one or more memories, and one or more computer readable hardware storage devices, said one or more hardware storage device containing program code executable by the one or more processors via the one or more memories to implement the methods of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Improvements and modifications can be made to the foregoing without departing from the scope of the present invention.

What is claimed is:

1. A system for device management in a datacenter having multiple racks adapted to house multiple devices, comprising:
   an optical sensor provided at a position in a rack in a datacenter, the optical sensor configured to sense device identifying data of a device inserted in the rack, wherein:
      the device identifying data is associated with a serial number of the device;
      the optical display comprises a light emitting diode controlled by firmware of the device and disposed in a casing of the device, the optical display configured to transmit the device identifying data; and
      the optical sensor comprises comprise a light communication reader; and
   a reporting unit at the rack that transmits the sensed device identifying data and the position in a message to a central data processing system for the datacenter, wherein the reporting unit:
      is communicatively coupled to a plurality of optical sensors at a plurality of positions in the rack; and
      comprises components configured to:
         receive device identifying data from one or more of the plurality of optical sensors;
         combine the device identifying data with positions of the one or more optical sensors in the message; and
         transmit the message to the central data processing system for the datacenter.

2. The system as claimed in claim 1, wherein the reporting unit is integrated with an intelligent power pole of the rack and wherein the message is transmitted from the intelligent power pole via a network connected power supply to the central data processing system.

3. The system as claimed in claim 2, wherein the message is transmitted from the intelligent power pole via an Internet Protocol address of the network connected power supply contained within a Domain Name Service for a network in the datacenter, and wherein the message indicates the rack from which the message was transmitted.

4. The system as claimed in claim 1, wherein the central data processing system comprises a processor and a memory configured to:
   receive messages from a plurality of reporting units associated with a plurality of racks in the datacenter; and
   dynamically maintain details for a plurality of devices in the plurality of racks.

5. The system as claimed in claim 1, further comprising a plurality of optical sensors attached to the rack at vertically spaced positions on a rear support of the rack.

6. A computer-implemented method for device management in a datacenter having multiple racks adapted to house multiple devices, comprising:
   providing a plurality of devices to a plurality of positions in a rack in a datacenter, wherein:
      the plurality of devices each comprise a light emitting diode disposed in a casing of the device and firmware, wherein the light emitting diode is controlled by the firmware of the device to transmit device identifying data, the device identifying data being associated with a serial number of the device;
      the rack comprises a plurality of optical sensors provided at positions on the rack, wherein the plurality of optical sensors are configured to sense the device identifying data of a device from the plurality of devices when the plurality of devices are inserted in the rack;
   combining the device identifying data with the positions of the plurality of optical sensors in a message; and
   transmitting the message to a central data processing system for the datacenter.

7. The method as claimed in claim 6, wherein the device identifying data includes a model number and a serial number associated with the device in the rack.

8. The method as claimed in claim 6, wherein the identifying data indicates a size of the device in the rack.

9. The method as claimed in claim 6, wherein the message to the central data processing system for the datacenter transmits via a network connected power supply.

10. The method as claimed in claim 9, wherein the message comprises an Internet Protocol address of the network connected power supply, wherein the Internet Protocol address is contained within Domain Name Service of a network for the datacenter, and wherein the Internet Protocol address identifies the rack.

11. The method as claimed in claim 6, further comprising, by the central data processing system in the datacenter:
   receiving the messages from a reporting unit associated with a plurality of racks of the datacenter; and
   dynamically maintaining details of the positions of a plurality of devices in the plurality of racks.

12. A system for device management in a datacenter having multiple racks adapted to house multiple devices, comprising:
   an optical sensor provided at a position in a rack in a datacenter, the optical sensor configured to sense device identifying data of a device inserted in the rack, wherein:
      the device identifying data comprises a graphical code attached to a casing of the device;

the graphical code is associated with a serial number of the device; and the optical sensor comprises a graphical code reader; and a reporting unit at the rack that transmits the sensed device identifying data and the position in a message to a central data processing system for the datacenter, wherein the reporting unit:

is communicatively coupled to a plurality of optical sensors at a plurality of positions in the rack; and comprises components configured to:

receive device identifying data from one or more of the plurality of optical sensors;

combine the device identifying data with positions of the one or more optical sensors in the message; and transmit the message to the central data processing system for the datacenter.

\* \* \* \* \*